United States Patent [19]

Fay

[11] Patent Number: 4,600,309
[45] Date of Patent: Jul. 15, 1986

[54] PROCESS AND APPARATUS FOR THEOPTICAL ALIGNMENT OF PATTERNS IN TWO CLOSE-UP PLANES IN AN EXPOSURE MEANS INCORPORATING A DIVERGENT RADIATION SOURCE

[75] Inventor: Bernard Fay, Sarotoga, Calif.

[73] Assignee: Thomson-CSF, Paris, France

[21] Appl. No.: 565,814

[22] Filed: Dec. 27, 1983

[30] Foreign Application Priority Data

Dec. 30, 1982 [FR] France .................. 82 22080

[51] Int. Cl.$^4$ .............................. G01B 11/00
[52] U.S. Cl. ..................... 356/401; 356/400; 356/356; 350/162.16
[58] Field of Search ............. 250/548, 561; 355/43, 355/45, 50, 125; 356/399, 400, 401, 354, 363, 396, 356; 318/640; 350/162.16

[56] References Cited

U.S. PATENT DOCUMENTS

| | | | |
|---|---|---|---|
| 4,037,969 | 7/1977 | Feldman et al. | 356/401 |
| 4,200,395 | 4/1980 | Smith et al. | 356/400 |
| 4,292,576 | 9/1981 | Watts | 318/640 |
| 4,311,389 | 1/1982 | Fay et al. | 356/400 |
| 4,326,805 | 4/1982 | Feldman et al. | 356/401 |

FOREIGN PATENT DOCUMENTS

| | | |
|---|---|---|
| 0010998 | 5/1980 | European Pat. Off. . |
| 2392421 | 12/1978 | France . |
| 2073950 | 10/1981 | United Kingdom . |

*Primary Examiner*—F. L. Evans
*Assistant Examiner*—Joel L. Harringa
*Attorney, Agent, or Firm*—Oblon, Fisher, Spivak, McClelland & Maier

[57] ABSTRACT

The present process makes use of at least two pairs of supplementary marks used for evaluating the relative dimensional distortions of the mask and the wafer, apart from three pairs of alignment marks respectively inscribed on a mask and a wafer disposed in parallel and in proximity relationship. Each pair of marks comprises a Fresnel zone lens and a broken line forming a grating with a constant spacing. Following alignment with the aid of the alignment marks, the supplementary marks are used for determining the amplitude of the distortions. The source - mask distance is adjusted to compensate the linear distortions and the positioning of the mask is adjusted to compensate the non-linear distortions.

10 Claims, 15 Drawing Figures

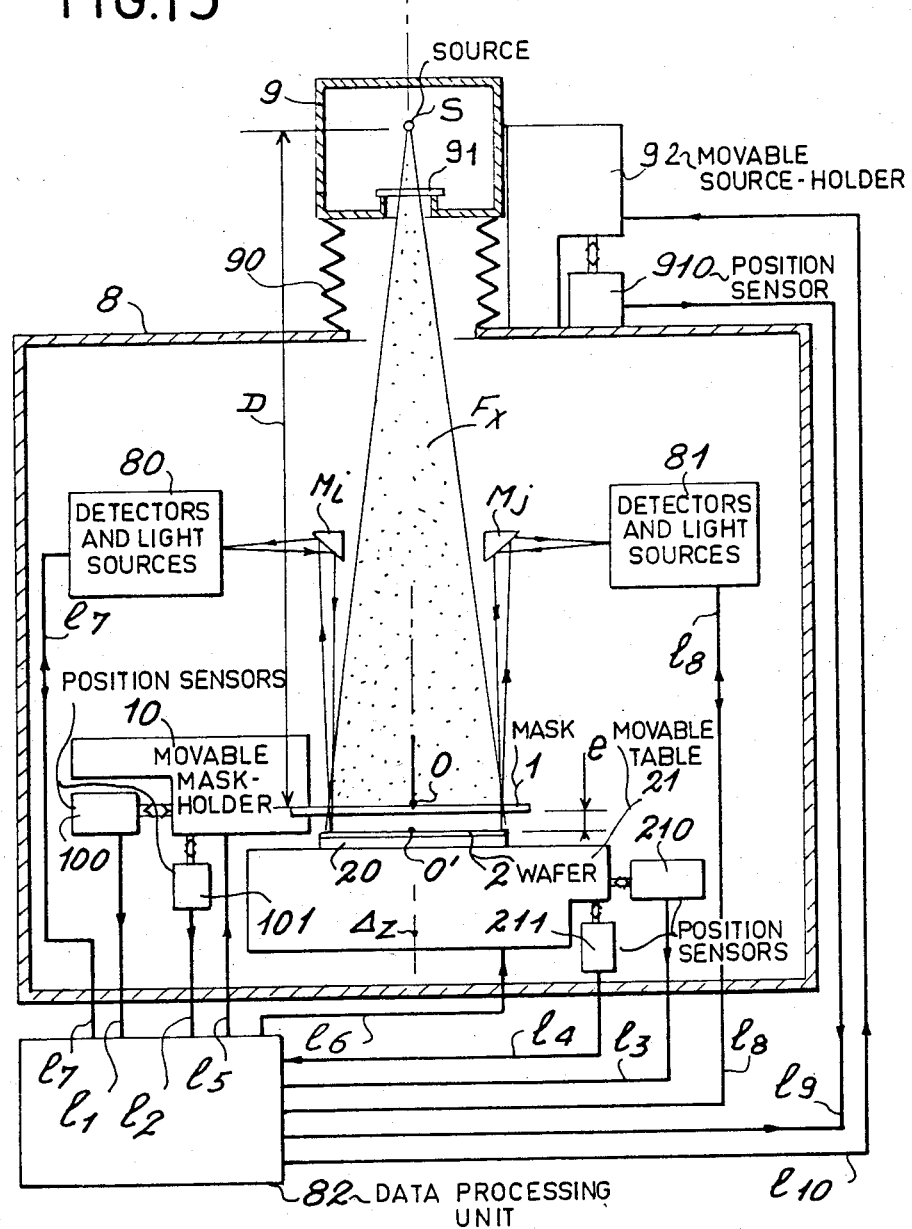

PROCESS AND APPARATUS FOR THE OPTICAL ALIGNMENT OF PATTERNS IN TWO CLOSE-UP PLANES IN AN EXPOSURE MEANS INCORPORATING A DIVERGENT RADIATION SOURCE

BACKGROUND OF THE INVENTION

The invention relates to the production of circuits by microlithography and more specifically to a process for the optical alignment of masks and substrates located in close-up planes i.e., planes in close proximity.

The production of integrated circuits involves the formation on a substrate of windows making it possible to position the installation or treatment. This substrate is covered with a photosensitive resin layer. The windows are produced by masking this resin from a mask. Transfer has been carried out by direct contact or proximity and more recently by the optical projection transfer method. Although the proximity transfer method has been in existence for a considerable time, it is still valid when the radiant energy source is e.g. constituted by a source emitting in the X-ray range.

Thus, in means for reproducing masks by a cast shadow using a high energy radiation source, such as X-rays, electrons and ions, it is possible to reproduce patterns or motifs having dimensions much smaller than a micrometer and down to 1/10 micrometer, whilst retaining a separation distance between the planes of the masks and the substrate of several micrometers, in order to prevent any contact, which constitutes a source of damage. Under these conditions, the effects of photon or corpuscular diffraction are negligible.

As a result of the absence of image-forming optical elements, the resolving power of these systems is independent of the dimensions of the useful field covered, which makes it possible to envisage the production of micronic and submicronic circuits by projecting masks having a large surface area, diameter of 100 mm or more, so that it is possible to achieve very high production rates for such circuits.

An apparatus for the reproduction of patterns using this procedure has a substrate which is exposed to the action of X-rays or more generally to radiant energy radiation through an appropriate mask, located at a few micrometers from the substrate. Each operation requires a precise alignment of the mask and the substrate. In order to obtain this alignment with an accuracy of about 1/10 micrometer, several alignment processes using the properties of diffracting light by gratings have been described, e.g. the Moiré fringes method, or the Torii and Smith methods. These methods consist of inscribing on the mask and the substrate, gratings having predetermined spacings and then detecting the radiation diffracted by these two gratings located in the close-up planes.

However, all these methods leave an uncertainty as a result of the periodicity of the detected signal and it is then necessary to remove this uncertainty by another method.

To obviate these disadvantages, it has been proposed in U.S. Pat. No. 4,311,389, to align two close-up planes and the alignment apparatus utilizing this process makes it possible to obviate the disadvantages of the aforementioned processes, whilst in particular making it possible to obtain a very accurate alignment of the two close-up planes and to tolerate, without alignment precision loss, larger spacing variations of the two planes than in the prior art alignment processes.

To this end, a lens with linear Fresnel zones is inscribed on the mask and a line, whose width is the same or greater than the width of the smallest Fresnel zone inscribed on the mask is inscribed on the substrate. The illumination of the mask by a parallel monochromatic light beam, e.g. a laser, makes it possible to form a rectangular light spot (focus) on the substrate and this corresponds to the order of diffraction +1 which, on covering the marking line formed on the substrate, leads to the detection of an illumination maximum or minimum of the radiation reflected by the substrate depending on whether the mark inscribed on the substrate has a larger or smaller reflecting action than the zone surrounding it.

This process makes it possible to align under good conditions, all the points of maximum diameter zones, typically equal to 10 mm, for line widths down to 0.2 micrometers. More generally, the maximum permissible zone diameter corresponds to approximately $10^5$ resolution points, which does not make it possible to take advantage of all the possibilities offered by the cast shadow reproduction process and which were referred to hereinbefore.

This limitation is essentially due to the relative dimensional distortions which inevitably occur on increasing the dimensions of the mask and correlatively the substrate, because transfer takes place with a 1/1 magnification.

Thus, other than by dividing the mask and the substrate into elementary zones to be individually aligned, it is not possible to use a mask with a diameter of 100 mm or more in a continuous manner for the aforementioned line width.

However, it would be possible to use larger masks, if it was possible to place means for compensating the relative dimensional distortions of the mask and the semiconductor wafer after each stage of the circuit production process, in order to guarantee the precise alignment of all the patterns on the complete field to be covered.

SUMMARY OF THE INVENTION

This is the object of the invention, and to this end a process is proposed for the precise alignment of two close-up planes having a large useful surface area making it possible to compensate the relative linear distortions of two planes. The invention also proposes an alignment apparatus for performing this process.

The present invention therefore relates to a process for optical alignment along two orthogonal axes of patterns in two close-up planes in an exposure means, incorporating a divergent radiation source located at a given distance from the first plane, said patterns having relative dimensional distortions, wherein the process comprises:

a preliminary stage of inscribing three pairs of reference patterns disposed on two orthogonal axes (x, y) parallel to said alignment axes and intersecting at a point O in a central region of the patterns to be aligned, the reference patterns of each pair inscribed on the first plane being formed by at least one lens having linear Fresnel zones, which are alternately opaque and transparent and perpendicular to one of the alignment axes in said plane, and reflecting reference patterns inscribed on the second plane and having a central zone perpendicular to said alignment axis, the central zone of the reference pattern also being etched to form a reflector phase grating having a constant spacing p extending parallel to the axes x, y on which they are arranged;

a stage during which the two planes are positioned parallel to one another, to within a given tolerance e;

an alignment stage along said two orthogonal axes x, y and in rotation about an axis $\Delta_z$ orthogonal to the two planes and intercepting the divergent radiation source, said alignment stage consisting of illuminating, by means of a parallel monochromatic light beam, each lens with linear Fresnel zones in such a way as to form in the second plane, a line of light having substantially the same dimensions as the central zone of the patterns inscribed on said plane, the detection of a fraction of the radiation reflected by said second plane and emerging from the lens with linear Fresnel zones, the displacement of the two planes relative to one another until the detected radiation passes through an extreme value corresponding to the alignment of the two reference patterns, followed by the repetition of these operations for each of the axes to be aligned, said divergent radiation source forming on the second plane the image of the pattern of the first plane by cast shadow with a magnification G obeying the equation $G = 1 + e/D$, in which e is the given tolerance between the two planes and D the distance separating the source from the first plane;

a second preliminary stage consisting of inscribing on two orthogonal axis x',y' intersecting at the insertion point of axes x, y on which are inscribed the pairs of alignment reference patterns, at least two pairs of supplementary reference patterns 600–700 to 603–703 of an identical nature to the alignment reference patterns, the reference patterns of each pair extending in a direction $\Delta_0$ to $\Delta_3$ orthogonal to the two axes x',y';

a stage following the alignment stage for determining the dimensional distortions of the two patterns consisting of operations of illuminating by a parallel monochromatic light beam $F_e$ each lens having linear Fresnel zones pairs of supplementary reference patterns, in such a way as to form in the second plane a line of light having substantially the same dimensions as the central zone of the patterns inscribed on this plane, detecting a fraction of the radiation reflected by said second plane and emerging from the lens having linear Fresnel zones in accordance with said orthogonal directions $\Delta_0$ to $\Delta_3$ for the displacement of the two planes relative to one another until the detected radiation passes through an extreme value corresponding to the alignment of the two reference patterns, storing the displacement Oa, Ob, Oc, Od in sign and amplitude, followed by the repetition of these operations for each pair of supplementary patterns and the determination of a correction quantity on the basis of the successive displacement values;

an adjustment stage of said magnification G on the basis of the correction magnitude in order to obtain a compensation of the relative dimensional distortions.

BRIEF DESCRIPTION OF THE DRAWINGS

The invention is described in greater detail hereinafter relative to non-limitative embodiments and with reference to the attached drawings, wherein show:

FIG. 15 the application of the apparatus according to the invention to an automatic X-ray exposure means.

DETAILED DESCRIPTION OF THE INVENTION

As the invention uses certain of the arrangements described in U.S. Pat. No. 4,311,389, it would appear useful to refer to certain of the main characteristics.

Figure 1:
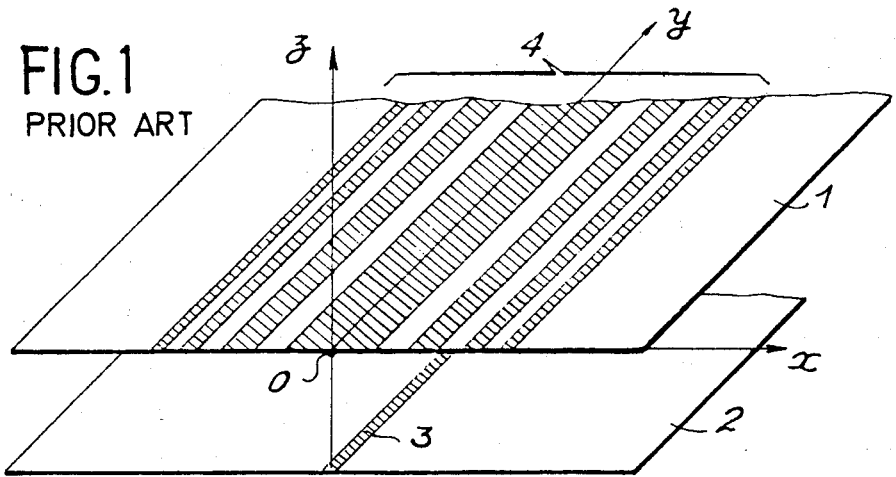
FIG. 1 an example of the designs inscribed on the mask and the substrate for the alignment.

FIG. 1 diagrammatically shows the designs necessary for alignment on a mask 1 and a substrate 2. On mask 1 has been inscribed a lens 4 having linear Fresnel zones, formed from strips of unequal width and distributed in accordance with a Fresnel distribution and alternately opaque and transparent.

The central strip has been shown opaque, but the reverse arrangement is also possible. On an axis parallel to the alignment direction Ox and perpendicular to the direction Oy of the strips, the transitions between these strips have respectively for the abscissas $r_n$ such that:

$$\frac{r^2}{r_n} = nF + \frac{n^2\lambda^2}{4} \qquad (1)$$

in which n is the number of the strip, F is the desired focal length for the lens and $\lambda$ is the wavelength of the monochromatic radiation illuminating said lens. The focal length F corresponding to the main focus of order 1, $F_1$ of the lens is equal to the distance separating the two planes to be aligned, namely the plane of the mask and that of the substrate. This distance is approximately 1/10 micrometer. Due to the fact that the surfaces of the strips are not equal (the Fresnel zones being linear), the contribution of the different zones to the diffracted radiation decreases rapidly on moving away from the central strip. Therefore, a lens formed by a relatively small number of strips is sufficient for obtaining a correct efficiency. In the extreme case, the lens can be limited to a single zone, i.e. the central zone.

Figure 2:
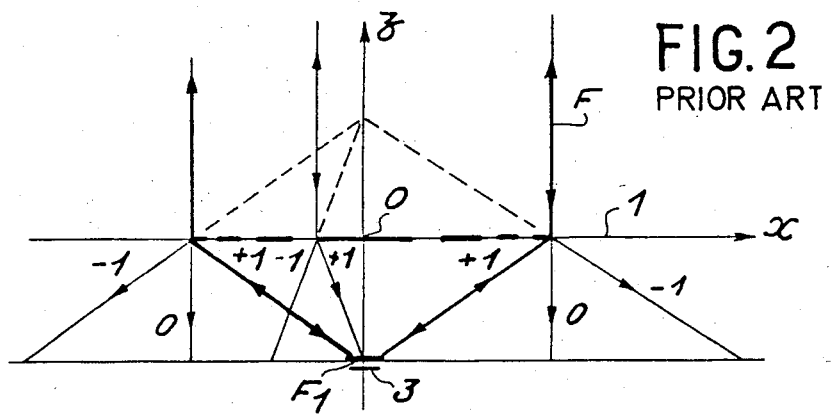
FIGS. 2 and 3 diagrams explaining the operation of the alignment means.

FIG. 2 shows a diagram, in plane xoz, of the radiation diffracted by such a lens illuminated by a parallel beam F. Without diffracting it (order O), this lens transmits part of the radiation and diffracts another part thereof by forming for an infinity source, real images corresponding to orders +1, +2, etc and virtual images corresponding to orders −1, −2, etc. In FIG. 2, orders 0, 1 and −1 are shown. The light spot formed on the substrate, when the substrate plane is at a distance from the mask which is equal to the main focal length (order +1) of the lens, is a strip, whose width is approximately equal to the width of the external strips of the Fresnel zone lens. When the plane of the substrate is at a distance greater than or smaller than the focal length, the order 1 is then concentrated on the substrate at a light spot which is slightly wider and slightly less concentrated, but which is still usable for obtaining the alignment.

A line 3 is inscribed on substrate 2 and is either more reflecting, or less reflecting than the zone which it surrounds. In both cases, the radiation reflected by the substrate can be used for obtaining the alignment. In the first case, the radiation reflected by the substrate is usable for obtaining the alignment. In the first case, the detected reflected radiation passes through a maximum when the order 1 diffracted by the lens having linear Fresnel zones and the line are aligned and in the second case the detected reflected radiation passes through a minimum.

In order that the alignment is obtained with a good degree of precision, it is necessary for the width d of the light spot to be substantially equal to the width 1 of the reference line inscribed on the substrate, in such a way that there is a position in which all the radiation concentrated in order 1 of the diffracted beam is reflected or absorbed and a relatively contrasted extreme value is obtained with respect to the radiation permanently reflected by the substrate.

Figure 3:
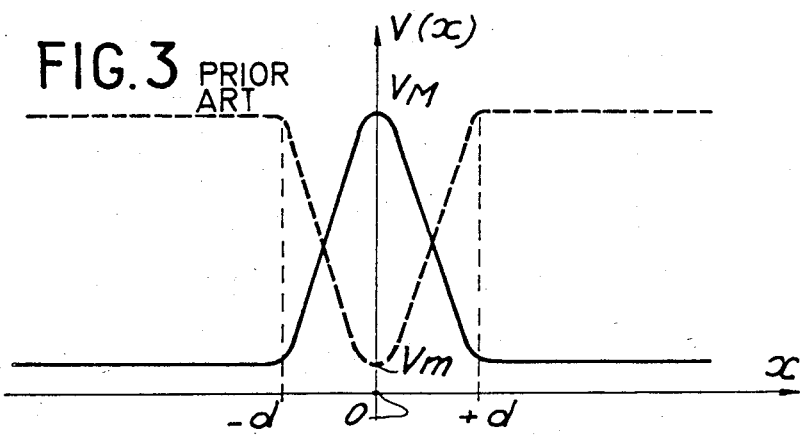

FIG. 3 shows an example of the detected signal V(x) for w=d in continuous line form when the mark is reflecting and in dotted line form when the mark is absorbing, the lens being moved relative to the mark along axis Ox, the extreme value being $V_M$ or $V_m$, depending on whether the mark is reflecting or absorbing.

When the distance between the substrate plane and the mask plane varies around the main focal length of the lens, the contrast reduces, but this distance is not critical and the control can still be obtained. Moreover, it is possible to use signal maximum variations for carrying out a fine adjustment of said distance to a predetermined value.

The radiation reflected by the substrate again passes through the lens having Fresnel zones and can be detected after separation with respect to the instant radiation carried out e.g, by a beam splitting plate. However, such a system leads to an interaction between the useful radiation and the radiation diffracted by the mask.

Several arrangements can be adopted for obtaining a spatial separation of the radiation reflected or diffracted by the mask and the return radiation emerging from the mask after reflection on the substrate. The performance levels of such arrangements rise in proportion to the way in which they minimize the detected continuous background and retain the symmetry of the system, so as to reduce the influence of certain parameters, such as e.g. the spacing.

These arrangements have been described in the aforementioned U.S. Patent and among these one of the most advantageous will be described in connection with FIGS. 4 and 5.

Figure 4:
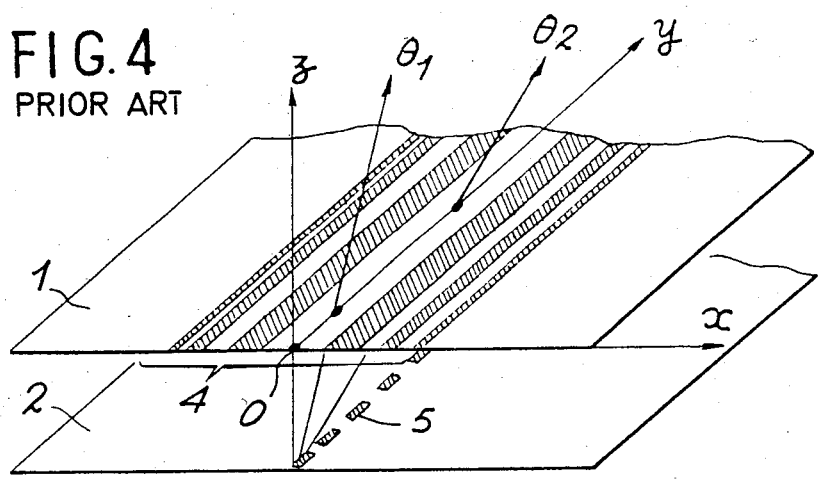
FIGS. 4 to 6 examples of optical devices usable for separating the return radiation reflected by the substrate from the ambient radiation and bringing about the alignment in accordance with two orthogonal axes in one plane and rotating about an axis normal to said plane.
Figure 5:
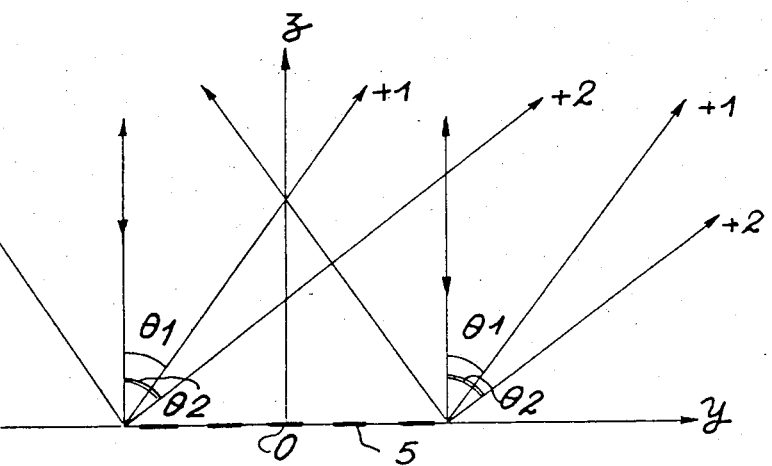

The apparatus illustrated in FIG. 4 uses the diffraction properties of gratings having a constant spacing. The continuous line 3 inscribed on the substrate of FIG. 1 is replaced in FIG. 4 by a broken line 5 in direction Oy forming a grating of spacing p. The apparatus then functions in the following way. The parallel radiation is normally (or obliquely) incident on mask 1 and forms on the substrate 2 a rectangular light spot elongated in direction Oy and corresponding to the direction of the line. The radiation received in this way by the line is reflected in accordance with order 0 of the grating formed by the line and diffracted in directions of the plane yoz forming with axis Oz an angle $\theta_n$, such that $\sin \theta_n = np/(2)$, n being the order of diffraction and $\theta_n$ the corresponding diffraction angle. In each of these diffraction directions, detection means make it possible to detect a maximum when the light spot and the broken line are aligned. As these directions are oblique relative to the incident beam, the return radiation does not interact with the radiation reflected by the mask. FIG. 5 shows the radiation diffracted by the broken line 5 in plane yoz.

The order +1, diffracted in plane yoz is obliquely incident on Fresnel zone lens 4. Therefore, as the diffracted light source is in the focal plane of the lens, the radiation emerges from the lens in a parallel beam, which is oblique with respect to the lens axis.

In the embodiment of FIG. 4, the broken line 5 forming a grating with a constant spacing p is realised in the form of zones having different reflection coefficients, obtained by deposition through a mask of compound which is more or less reflecting than the actual substrate.

A reflecting grating making it possible to deflect the return beam can also be obtained by forming a reflector phase grating along a line extending in direction Oy by periodic relief variation of a calculated depth.

The arrangements described hereinbefore only permit an alignment in a single direction, Ox in the illustrated example. In order to obtain a complete alignment, it is possible to inscribe on the substrate two other Fresnel zone lenses, whose lines are parallel to Ox and a corresponding line can be inscribed on the substrate parallel to Ox in such a way as to carry out the alignment in direction Oy and in rotation.

Figure 6:
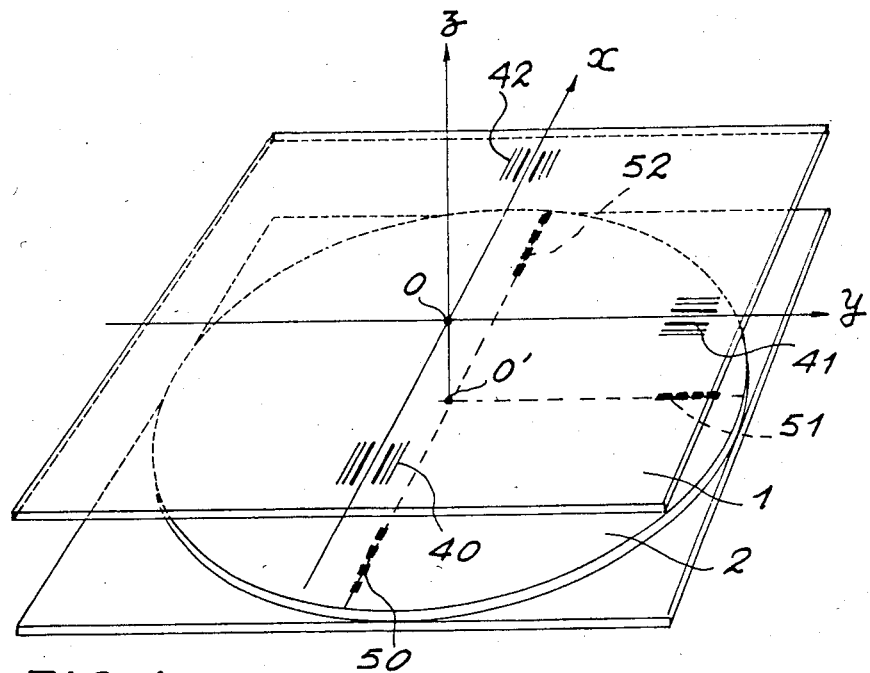

FIG. 6 illustrates a group of marks permitting the complete alignment of substrate 2 relative to mask 1. There are three reference zones 40, 41, 42 in the plane of the substrate and in which are inscribed Fresnel zone lenses.

In zones 40 and 42, the strips are parallel to Ox and in zone 41, the strips are parallel to Oy. This arrangement, in which the Fresnel zone strips and the corresponding lines on the substrate are arranged in substantially radial directions, is particularly interesting when the substrate is exposed to the mask to X-rays, because they are slightly divergent and the pattern is slightly radially deformed, but the positioning is not prejudiced. These three reference zones permit an alignment of the substrate in x, in y and in rotation about an axis orthogonal to the planes of the substrate and the mask.

However, for the reasons referred to hereinbefore, in the case of wafers and masks whose useful field to be recorded has a diameter corresponding to a resolution typically exceeding $10^5$ points, it is no longer possible to ensure a correct alignment of all the points of the useful field of the substrate relative to the mask. The physical phenomena involved will now be described in greater detail.

The dimensional distortions of the semiconductor wafers and more particularly the silicon wafers have formed the subject for numerous studies in connection with various prior art processes and at different stages in the production of integrated circuits. For example, reference is made to the article by YAU, which appeared in the Journal "Applied Physics Letters", Vol. 33, No. 8, 15.10.1978, pp. 756–758. It would appear that the main distortions are linear and consequently correspond to an isotropic contraction or expansion of the silicon. The non-linear part of these distortions is of very low amplitude and is difficult to measure.

In the case of the distortions associated with the mask, it is also necessary to distinguish between the linear part of these distortions and which also preponderates and the residual non-linear distortions.

In both cases, the linear distortions observed are of a few p.p.m., to which it is necessary to add the linear distortions produced by possible temperature variations, typically 2.5 p.p.m/°C. for silicon.

The linear distortion can be compensated by a variation in the magnification of the projected image of the mask, provided that this magnification is checked and that it is possible to evaluate the magnification correction to be made.

Figure 7:
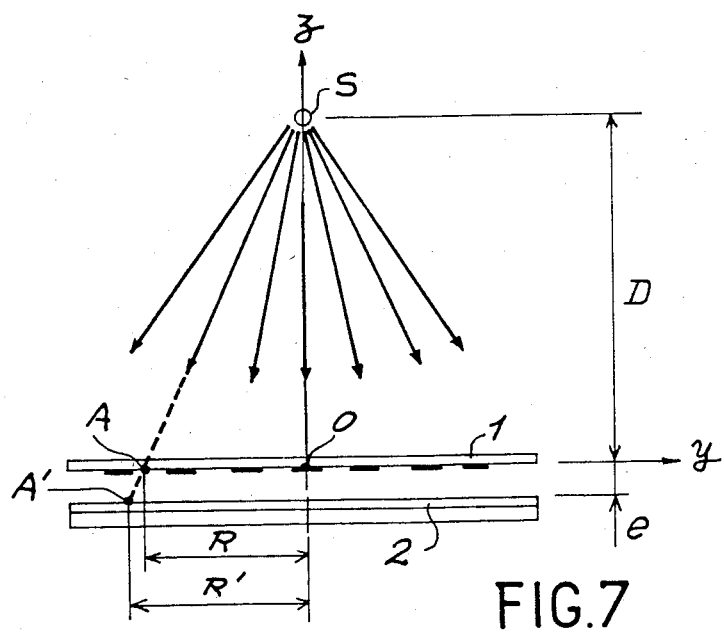
FIGS. 7 and 8 diagrammatically, the relative dimensional distortions phenomena between a mask and a substrate.

The reproduction of masks by X-rays generally involves the use of a quasi-punctiform, X-ray divergent source S, as diagrammatically illustrated in FIG. 7. This source is placed at a distance D from mask 1 and a wafer 2 is separated by an interval E from mask 1. If A' is the image of a point A of the mask on the wafer, said projected image is magnified by a factor:

$$G = \frac{R'}{R} = 1 = \frac{e}{D} \qquad (3)$$

This magnification always exceeds unity. It is possible to define a nominal value $G_0$ corresponding to a nominal tolerance $e_0$ and a nominal distance $D_0$.

It is therefore possible to check the magnification by varying either the distance e between the mask and the wafer, or the distance D between the source and the mask, or by varying both of them. The variations of the magnification $\Delta G_1$ and $\Delta G_2$ obtained by the variations $\Delta e$ of the mask—wafer distance or $\Delta D$ of the source—mask distance are given by the following equations:

$$\Delta G_1 = \frac{\Delta e}{D} \qquad (4)$$

$$\Delta G_2 = (e/D^2)\Delta D \qquad (5)$$

For typical values of these parameters:
D=400 mm, e=40 μm, Δe=±2 μm and ΔD=±40 mm, it is possible to obtain:

$$\Delta G_1 = \pm 5.10^6 \qquad (6)$$

$$\Delta G_2 = \pm 10^{-5} \qquad (7)$$

Thus, these magnification variations are sufficient to permit the compensation of the conventional linear deformations of masks and wafers.

A description will now be given of the process for aligning patterns in two close-up planes according to the invention permitting the evaluation of the magnification corrections to be made in the projection.

With regards to the actual alignment, use is made of the alignment process described in the aforementioned U.S. Patent and which has just been described. Use is made of at least three references on the substrate, as described relative to FIG. 6 and preferably of the type illustrated by FIG. 4, i.e. consisting of an elongated mark in the form of a broken line forming a constant spacing grating.

This arrangement of references 40 to 42 and 50 to 52 (FIG. 6) makes it possible to obtain an automatic centering of the two planes arranged around an origin (on the plane of mask 1) and its projection O' (on the plane of substrate 2).

Figure 8:
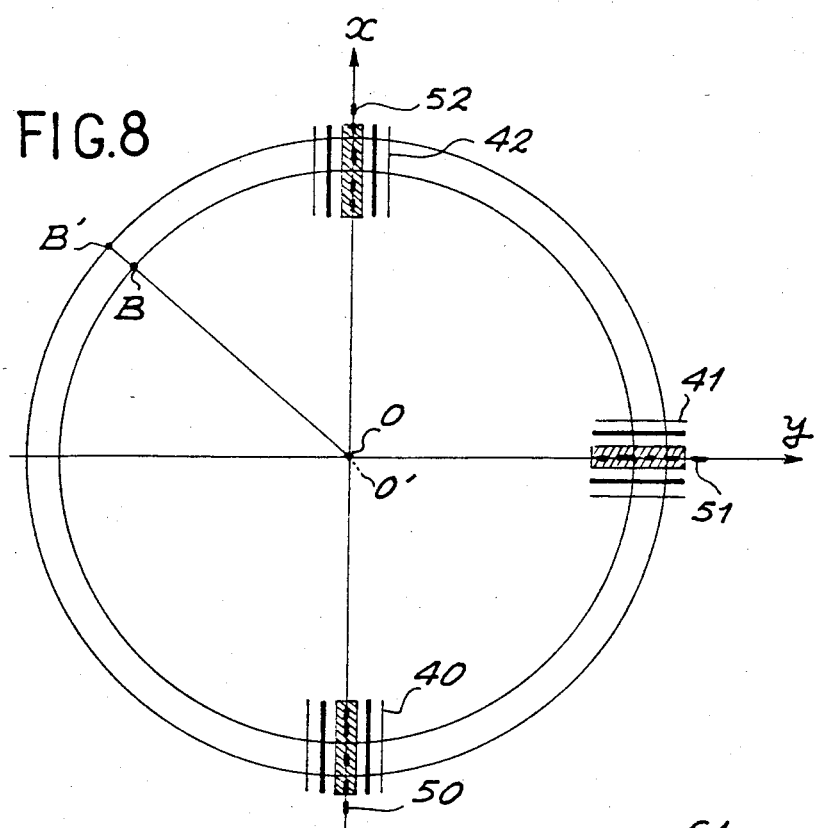

If the plane of substrate 2 is slightly enlarged compared with the plane of mask 1, in the manner shown in FIG. 8, points O and O' are aligned, but a point B' corresponding to a point B located on the mask periphery is no longer aligned.

The aforementioned alignment apparatus makes it possible to obtain the very precise automatic alignment (precision of approximately 0.01 μm) of three alignment marks, i.e. of all the points in two close-up planes, 1 and 2, if these two planes can be strictly superimposed.

In the case of a relative scale variation of the two planes, the sentence O and O' of the two planes remain strictly aligned, but the type BB' (FIG. 8) superimpositioning tolerances increase in a linear manner with the distance from the centre. It is also possible to angularly align the planes 1 and 2, because the reference alignment lines 40 to 42 on the one hand and 50 to 52 on the other are disposed in radial directions. The variations of the magnification ΔG are of small amplitude (relation 6), so that the focused spots imaging the Fresnel zone lenses 40 to 42 will at least partly overlap in radial directions, the references 50 to 52 carried by substrate 2. It is therefore possible to detect an alignment signal maximum of the pairs of references.

However, it is necessary to be able to measure the relative scale variation of the two planes, in order to be able to correct the magnification of the projected image of the first plane 1, so as to obtain a strict alignment with all the points of the second plane 2.

To this end and in accordance with one of the most important aspects of the invention, use is made of at least two other pairs of marks having the following special features:

(a) The marks are located at the periphery of the useful field in the same way as the alignment marks, but their lines are arranged orthogonally with respect to the radial directions.

(b) These supplementary marks are located on two axes orthogonal to one another.

Figure 9:
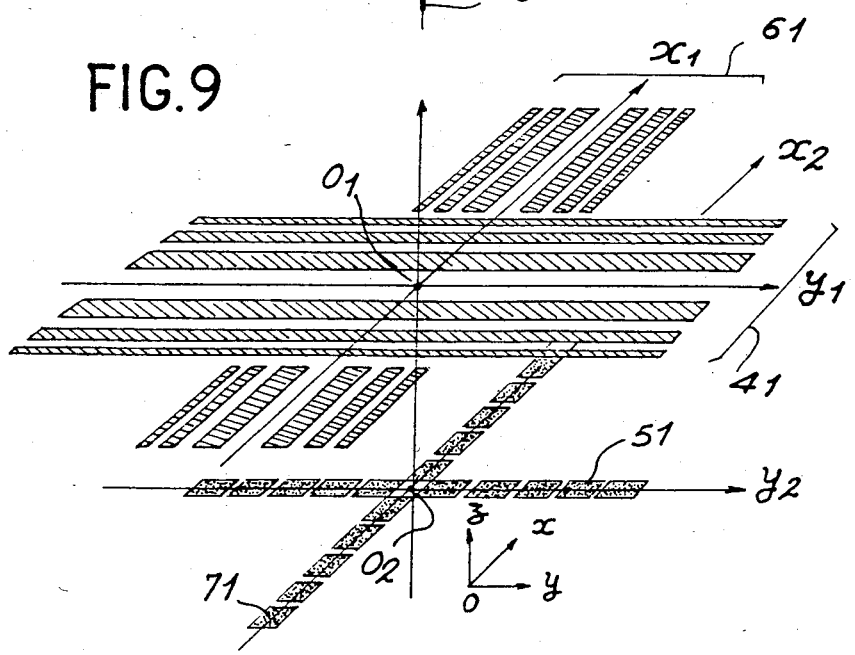
FIG. 9 an example of the arrangement in accordance with a first variant used for evaluating the distortion according to the invention.

A first example of the pairs of marks satisfying these conditions is illustrated in FIG. 9. This illustrates the marks corresponding to the location of marks 41, 51 in FIG. 6.

There are also two marks unchanged. The lines of these marks 41 and 51 are aligned on axes $y_1$ and $y_2$ respectively, parallel to axis Oy. Apart from these marks, which are used for alignment in the aforementioned manner, there are two supplementary marks 61, 71, respectively a Fresnel zone lens and a broken line forming a constant spacing grating. The marks of the Fresnel zone lens and the broken line are disposed along axes x and $x_2$ respectively, orthogonal to axis Oy and therefore to axes $y_1$ and $y_2$.

The spot, which is the image of the Fresnel zone lens forming mark 41 and focused on mark 51 produces orders of diffraction in a plane parallel to axis ox, as hereinbefore, and the spot which is the image of the Fresnel zone lens forming mark 61, focused on mark 71, produces orders of diffraction in a plane parallel to axis oy. It is therefore possible to detect and discriminate signals corresponding to the superimposing of the two pairs of marks.

The first signals are used for the angular alignment of the two planes 1 and 2 and the second signals for evaluating the relative dimensional distortions of these two planes. Naturally, as indicated hereinbefore, it is necessary to have at least one second pair of supplementary marks. The marks must be disposed on an axis orthogonal to axis ox e.g. in the region of alignment marks 40 and 50.

In order to increase the discrimination possibilities between the channels for the alignment and evaluation of the dimensional distortion, it is possible to give the gratings forming marks 51 and 71 different spacings.

In FIG. 9, the two pairs of gratings are shown perfectly aligned. Their centres of symmetry, respectively $O_1$ and $O_2$ intersecting axes x, y and $x_2,y_2$ are then on the same axis $z_{12}$ parallel to axis oz.

However, although the structure described hereinbefore and which can be qualified as composite has the advantage of permitting the partial use of illumination and detection means which are common to the two dimensional distortion evaluation and alignment channels, there is a risk of interference between the unwanted signals and the wanted signals due to orders of diffraction produced by the Fresnel zone lenses. Thus, if the grating of mark 71 produces orders of diffraction in a plane parallel to plane zox, the Fresnel zone lens 41 in turn produces interfering orders of diffraction in this plane which, even if they are of small amplitude, they interfere with the only useful first orders of diffraction. The same applies to the alignment channel.

In addition, for eliminating any coupling, according to a preferred variant of the invention pairs of supplementary marks are arranged on axes which are naturally orthogonal to one another but which are separate from the axes on which are arranged the pairs of marks 40-50, 41-51 and 42-52 used for the alignment. In an optimum manner, these axes form an angle of $\pi/4$ radians with the axes on which are arranged the alignment marks.

Figure 10:
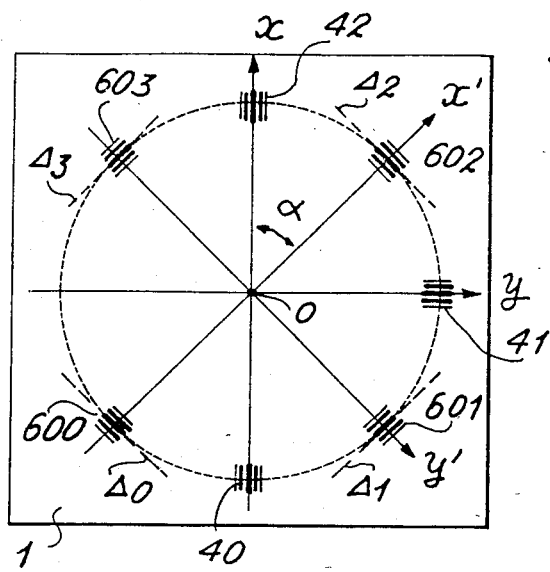
FIGS. 10 to 12 a second variant according to the invention.
Figure 11:
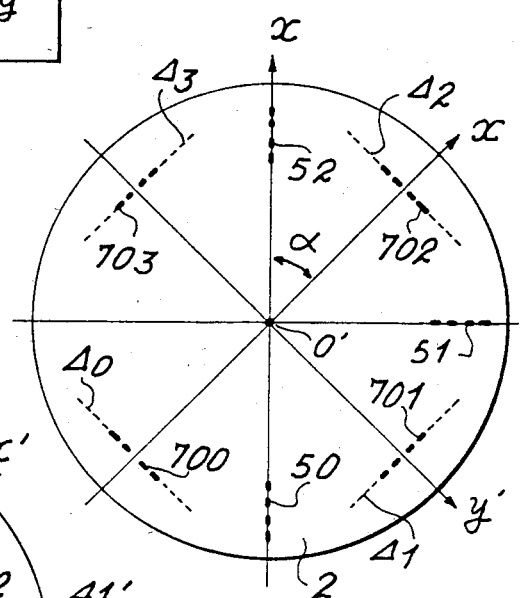

FIGS. 10 and 11 illustrate this arrangement. FIG. 10 shows the marks carried out by mask 1 and FIG. 11 the corresponding marks carried by substrate 2. Moreover, as illustrated and for reasons which will be explained hereinafter, it is preferable to use four pairs of supplementary marks rather than two.

The alignment marks, disposed on a circle of centre O (mask) or O' (substrate) forming the centre of gravity of the pattern to be reproduced and aligned on two orthogonal axes, are identical to those described hereinbefore and have the same functions. They carry the same references, 40 to 42 for mask 1 (FIG. 10) and 50 to 52 for substrate 2 (FIG. 11).

According to the invention, four pairs of supplementary marks are provided: 600 to 603 for mask 1 (FIG. 10) and 700 to 703 for substrate 2 (FIG. 11). These masks are also arranged on a circle of centre O or O', which can have the same radius as hereinbefore. These masks are centered on two axes x' and y' which are orthogonal to one another and preferably form an angle $\alpha$ of $\pi/4$ radians with reference axes x and y. The lines of these marks are aligned in accordance with axes $\Delta_o$, $\Delta_1$ and $\Delta_2$, $\Delta_3$, respectively orthogonal to axes x' and y'.

As for the alignment channel, the supplementary marks of the mask are lenses with linear Fresnel zones having a focal length equal to the nominal distance between the mask and the substrate or wafer. Each lens, which is illuminated in normal incidence by a laser beam, produces in its focal plane a rectangular spot of focused light, whereof it is possible to detect the convolution with the corresponding mark on wafer 2 in order to detect the position thereof.

Figure 12:
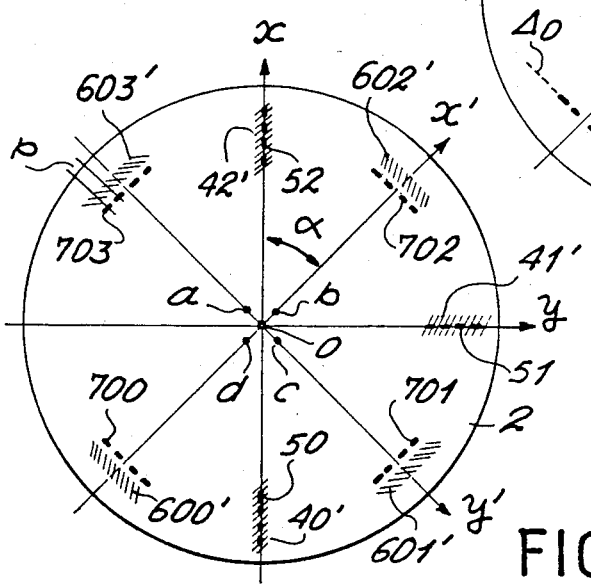

FIG. 12 shows the substrate 2, i.e. the semiconductor wafer with its marks 700 to 703 in the form of a broken line forming a grating of constant spacing p, whereof the different orders of diffraction are given by the equation $\sin \theta_n = n\lambda/p$, in which n is the order of diffraction and $\lambda$ the wavelength of the laser beam. FIG. 12 also shows in the form of hatched lines, the focused light spots 600' to 603' produced by the illumination of the mask marks on the substrate, which is assumed to be aligned with the aid of marks and placed at the correct distance from mask 1. The positions of the focusing spots 40' to 42' of the marks 40 to 42 on marks 50 to 52 are also shown in FIG. 12. In the case illustrated by FIG. 12, the projection of mask 1 is not at the same magnification as wafer 2. Wafer 2 is assumed to be contracted with respect to the mask.

The apparatus for performing the process according to the invention and which will be described hereinafter, includes mechanical or electromechanical means making it possible to displace wafer 2 relative to mask 1, as well as to very accurately measure the displacement performed.

Starting from the aligned position, for which use has been made of the pair of marks 40-50, 41-51 and 42-52, details of the positions of the wafer supplied by the position sensors or transducers are stored, i.e. the displacement necessary for aligning in turn each of the four pairs of marks 600-700, 601-701, 602-702 and 603-703, the alignment measurements being carried out with the aid of an optical system also described hereinafter and reproduced four times in the vicinity of each pair of marks.

During these operations, the centre O of the wafer has been successively brought to a, b, c and d and the corresponding position indications have been recorded. As stated hereinbefore, two pairs of marks are sufficient. However, the use of four pairs of marks makes it possible to form means values and improve the distortion evaluation quality.

The measurements of Oa, Ob, Oc and Od make it possible to evaluate the relative distortion of the two planes 1 and 2 and optionally make a distinction between a linear component and a non-linear component. The linear distortion can be compensated by varying the distance between the source and the mask D (FIG. 7), in accordance with equation 5, whilst the non-linear distortion can in part be compensated by an appropriate fine adjustment of the position of one of the two planes acting on the distance e between the mask and the wafer (FIG. 7) in accordance with equation 4.

Figure 13:
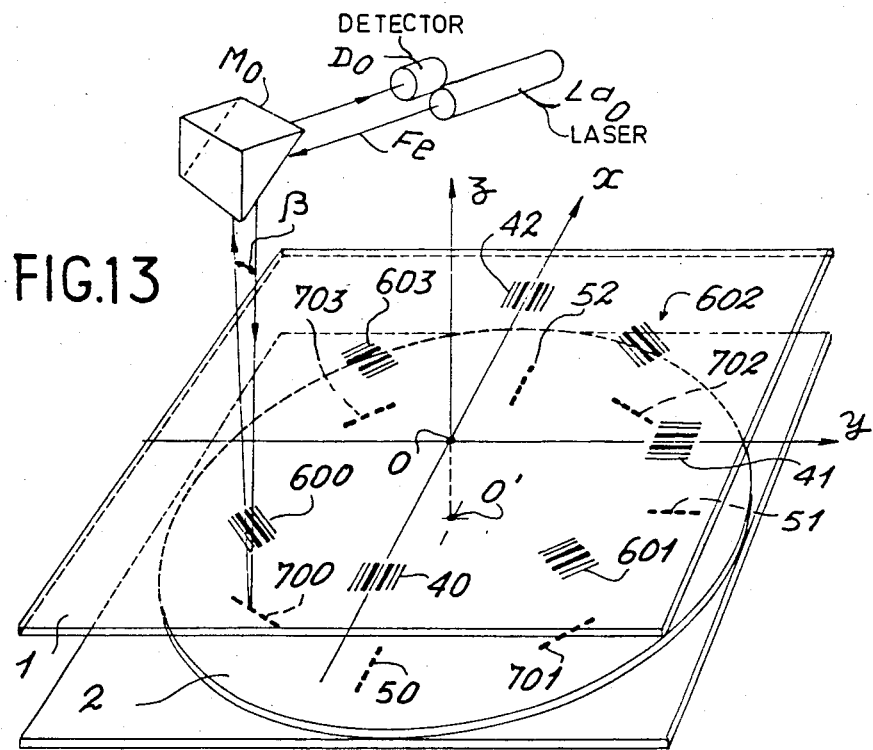
FIG. 13 diagrammatically, an apparatus for performing the process of the invention.

An example of an optical means making it possible to determine the alignment of a pair of supplementary marks will now be described in more detailed manner relative to FIG. 13. It simply consists of a laser $La_0$, a mirror $M_0$, regulated so as to obtain a fixed incidence angle, e.g. $\pi/2$ radians of the laser beam $F_e$ on a mark of mask 1, i.e. mark 600 in the illustrated example,. The laser beam $F_e$ is focused in the focal plane of said mark constituted by a Fresnel zone lens. When the corresponding mark 700 of the wafer is illuminated by the focal spot, it is possible to observe a return signal diffracted by an angle $\beta = \sin^{-1}(\lambda/p)$, transmitted by the Fresnel zone which can be detected after a further reflection on mirror $M_0$ with the aid of a photodiode $D_0$, $\lambda$ being the emission wavelength of the laser $L_a$ and p the spacing of the grating (mark 700). This signal has a very sharp maximum, when the two marks 600 and 700 are centered with respect to one another which makes it possible to obtain a precision of a few hundredths of a micrometer. In reality, the optical apparatus is reproduced four times around the mask. However, it is only necessary to use a single laser source, associated with beam splitters and mirrors.

Figure 14:
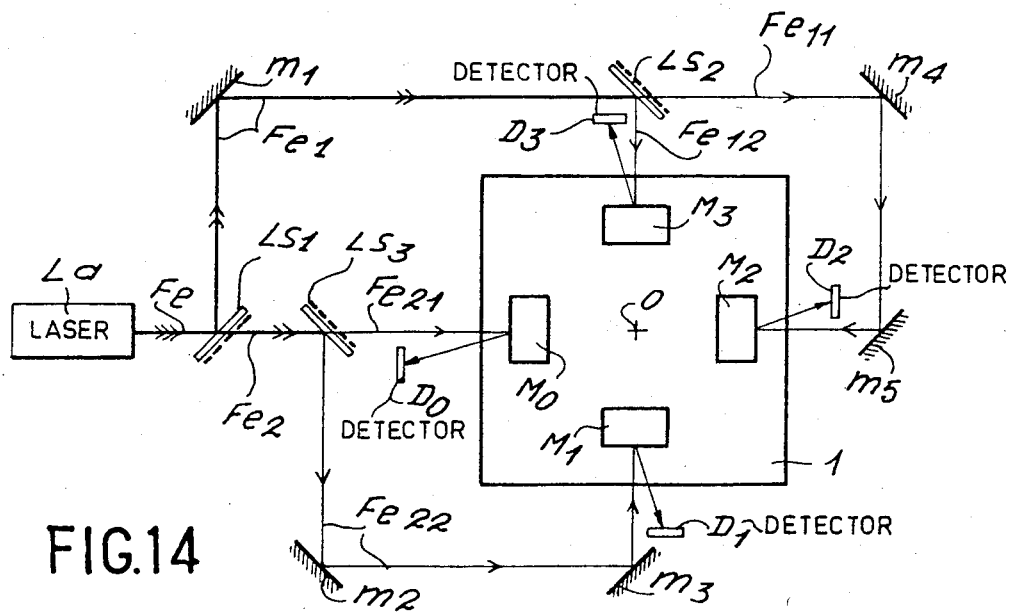
FIG. 14 a constructional variant of said apparatus.

FIG. 14 illustrates a possible embodiment. The beam $F_e$ emitted by a single laser is firstly split into two beams $F_{e1}$ and $F_{e2}$ by a semi-transparent plate $LS_1$ with a transmission and reflection coefficient differing only slightly from 0.5. In turn, beam $Fe_1$ is split into two beams $F_{e11}$ and $F_{e12}$ by a second semitransparent plate $LS_2$, identical to the first plate $LS_1$ and after reflection on a deviating mirror $M_1$. Beam $F_{e12}$ strikes a mirror $M_3$ associated with the pair of marks 603 and 703 (FIG. 13), in the manner described relative to mirror $M_0$. The beam diffracted on its return path is trapped, after reflection on mirror $M_3$, by a photodiode $D_3$ or any similar member. Beam $F_{e2}$ is also split into two beams $F_{e21}$ and $F_{e22}$. Beam $F_{e21}$ is reflected by a mirror $M_0$ associated with a pair of marks 600 and 700. A photodiode $D_0$ detects the diffracted beam. After reflection on two deviating mirrors $m_2$ and $m_3$, beam $F_{e22}$ is reflected by mirror $M_1$ associated with the pair of marks 601 and 701. A photodiode $D_1$ detects the diffracted beam. After reflection on deviating mirrors $m_4$ and $m_5$, beam $F_{e11}$ is reflected by mirror $M_2$ associated with the pair of marks 602 and 702 and a photodiode $D_2$ detects the diffracted beam. Mirrors $M_0$ to $M_1$ can be based on prisms having reflecting faces.

Although only slightly less than 25% of the emitted energy can be used for each pair of marks, bearing in mind the successive splitting operations and various losses, this structure is perfectly suitable because the necessary energy is low. For example, a helium-neon laser emitting on a wavelength centered on 0.6326 micrometers and of power 5 mW is sufficient within the scope of the present invention. Appropriate photodiodes associated with conventional electronic members are currently available. This aspect in no way differs from the prior art.

It has hitherto been assumed that the angle of incidence of the laser beam is preferably normal to the mask 1, which simplifies the optical setting. In the case of a non-normal incidence, the incidence plane defined by the normal to mask 1 and the incidence direction can be parallel to the lengths of the Fresnel zones, in order not to require any correction regarding the position of the marks of the wafer, as a function of the incidence angle.

The alignment marks (40-50, 41-51 and 42-52) and the relative dimensional distortion evaluation marks (600-700, 601-701, 602-702, 603-703) are inscribed in a permanent manner on wafer 2 following a preliminary optical or electronic masking operation prior to the first operation of masking by X-rays, electronic beams or ion beams.

The process according to the invention can be summarized in the following way:

(a) alignment of mask 1 relative to wafer 2 or vice versa and arrangement of the wafer and mask in two parallel planes separated by a nominal distance e;

(b) evaluation of the relative dimensional distortions of mask 1 and wafer 2;

(c) adjustment of the distance between the exposure source and the mask related to the evaluation carried out during phase (b), so as to correct relative dimensional distortions of the linear type;

(d) optionally, adjustment of the relative positions of mask 1 and wafer 2, so as to correct relative dimensional distortions of the non-linear type.

Following these alignment phases, exposure to X-rays takes place in order to reproduce the pattern of mask 1.

(Phase a) is common to the prior art, particularly that constituted by the aforementioned U.S. Pat. No. 4,3111,389, whereby it generally comprises the following stages:

Approximate relative positioning along axis OZ of the wafer and mask by means of a mechanical member, which makes it possible to define the nominal tolerance as approximately ±1 micrometer, visual prepositioning of the alignment marks relative to one another, the precision obtained along the two axes ox and oy being approximately ±0.5 mm.

Alignment along axis ox and oy and angular alignment by optical means, using the pairs of marks 40-50, 41-51 and 42-52.

At the end of this stage, mask 1 and wafer 2 are centered (O and O' coinciding) and angularly aligned (position shown in FIG. 12). This is followed by the fine adjustment of the nominal tolerance e, using alignment marks, during which the relative position of the planes with respect to the mask 1 and the wafer 2 is adjusted.

According to the invention, it is then only necessary to adjust the magnification given by equation (3) to take account of relative linear dimensional distortions. Although it was stated hereinbefore that the correction takes place by adjusting the source—mask distance D, it is also possible to act on the tolerance e between mask 1 and wafer 2. However, the possible adjustment amplitude is smaller and it is also preferable to work at a constant nominal tolerance e for the exposure phase following the alignment phases.

It has hitherto been implicitly admitted that the corrections take place in a "manual" manner, on the basis of the fact that from the amplitude and sign values Oa, Ob, Oc and Od, it is possible to on the one hand calculate the mean value between them and to deduce therefrom the corrections to be made. The correctional action can be initiated by an operator adjusting distance D (FIG. 7) and optionally the relative positioning of two facing planes. However, any distortion correction process can be carried out in an entirely automatic manner.

A means for carrying out the transfer by proximity incorporating an automatic apparatus for the alignment and correction of the relative dimensional distortions will now be described. It is assumed that there is transfer by means of X-rays. Moreover, the description is limited to the elements essential for the understanding of the invention, the transfer means per se falling outside the scope thereof.

FIG. 15 diagrammatically illustrates in section the architecture of such a transfer means. In per se known manner it comprises a pressurized enclosure 8, in which there is a low helium pressure of approximately 0.1 atm (98066.5 Pa).

The enclosure is linked with an X-ray generator via a bellows 90. The generator also has an enclosure 9 containing an X-ray source S, which can be considered as quasi-punctiform. Source S produces a divergent X-ray beam $F_X$ through a window 91 in enclosure 9 and which is generally based on beryllium. The main enclosure contains all the conventional components of a transfer means.

It firstly comprises a member 21 for prepositioning wafer 2, which is generally placed on a wafer holder 20. The positioning member permits movements of the wafer relative to a not shown reference trihedron, linked with the main enclosure. After alignment and regulating the position, the plane of wafer 2 is to be included in plane XY and in axis Z being orthogonal to the wafer plane.

In a conventional manner, with the aid of motors moving the substrate or wafer holder 20 in two directions of plane XY and rotating about an axis parallel to axis Z, wafer 2 can be prepositioned in two directions and in rotation about the axis parallel to axis Z. Finally, the position of the wafer holder 20 and therefore wafer 2 is adjusted with the aid of a not shown tripod, each leg thereof being movable in a direction parallel to axis Z.

The position of the wafer holder 20 and the wafer 2 in space is evaluated with the aid of two groups of position sensors or transducers, whereof only two are shown, namely a sensor 210 belonging to a group of two sensors for evaluating the position of the wafer relative to the two axes XY and a rotation sensor and a sensor 211 belonging to a group of three position sensors for wafer 2 used for evaluating the positioning, i.e. the positions $Z_1, Z_2, Z_3$ of three points along axis Z.

In the same way, mask 1 is joined to a positioning member permitting the relative alignment of mask 1 and wafer 2, with the aid of the aforementioned alignment mask (FIG. 13: 40–50, 41–51, and 42–52) and the regulation of the gap or tolerance separating wafer 2 and mask 1. To this end, there are also means for moving the mask along two orthogonal axes of plane XY and means for regulating its position along axis Z and its located about a mean position corresponding to the nominal gap e. The position according to Z and the location are regulated, as for the wafer, by means of a tripod, which makes it possible to define three positions $Z8'_1, Z'_2, Z'_3$.

There are also two groups of position sensors of which two are shown, namely one of the sensors 100 of a group of two position sensors of mask 1 along two orthogonal directions of plane XY and one of the sensors 101 of a group of three position sensors for mask 1 along axis Z: position $Z'_1, Z'_2$ and $Z'_3$.

For carrying out the alignment operation of mask 1 relative to wafer 2, it is necessary to illuminate the alignment marks with the aid of a laser beam and preferably with an orthogonal incidence to the mask, followed by the detection of the orders of diffraction in the manner described hereinbefore. To this end, there are provided optoelectronic means 80 for the emission and detection of light energy associated with deviating mirrors $M_i$. These means are preferably those described relative to FIG. 9 of the aforementioned U.S. Patent.

Apart from the components described hereinbefore and which are common to the prior art, the transfer means also comprises more specific members of the present invention. It firstly comprises optoelectronic means 81 for the emission and detection of light energy associated with a set of mirrors $M_j$. According to a preferred variant, these means are described relative to FIG. 14 and there are four mirrors $M_j$, namely $M_0$ to $M_3$ and there are four pairs of supplementary marks for evaluating the relative dimensional distortions, i.e. 600–700 to 603–703 (FIGS. 10, 11 and 13).

In addition, there are data processing means 82, e.g. a microprocessor associated with conventional data input-output means, means for converting analog signals into digital signals or vice versa, as well as more generally interface means are provided for the real time control of the different alignment and correction phases of the relative dimensional distortions. Therefore, the data processing means 82 receive, via transmission channels $l_1$ to $l_4$ signals generated by the different position sensors 100, 101, 210 and 211 which generate on other transmission channels $l_5$ and $l_6$ signals for controlling the positioning members 10 and 21 of the wafer holder 20 and the mask 1. These control signals are processed on the basis of the position information supplied by the position sensor and also, by a supplementary transmission channel $l_7$, information supplied by optoelectronic light energy emission and detection means 80. The data processing means also supply, via transmission channel $l_7$, control signals, particularly for controlling the emission of the laser source used for alignment, as well as the electrical power necessary for this source. In a conventional manner, the data processing means 82 include recorded programme control means, e.g. in a "R.O.M.". These arrangements make it possible to carry out the alignment phase of mask 1 relative to wafer 2 and the regulation of the nominal tolerance, which is common to the prior art.

When mask 1 and wafer 2 are aligned, the previously defined points O and O' (FIG. 13) are located on an axis $\Delta_z$ parallel to axis z. By prior positional adjustment, source S is disposed on this axis so as to symmetrically illuminate mask 1 and wafer 2.

In order to automatically carry out the subsequent evaluation and correction phases for the relative dimensional distortions, a supplementary transmission channel $l_8$ is provided for ensuring transmissions of bilateral signals between data processing means 82 and optoelectronic light energy emission and detection means 81 used in conjunction with pairs of supplementary marks for the evaluation of relative dimensional distortions. The signals carried are on the one hand signals supplied by photodiodes $D_0$ to $D_3$ (FIG. 14) and signals for controlling the laser source La (FIG. 14). The electrical power necessary for supplying laser source La is also carried by this channel.

The data processing means, controlled by the recorded programme, generate control signals on transmission channel $l_5$ permitting displacement of mask 1 along directions ox' and oy' in the case of the variant illustrated in FIG. 12, or more generally in all appropriate directions of plane xy, so as to realise the superimposing sequence of the different pairs of marks used for the evaluation of the relative dimensional distortions. The signals generated by the position sensors 100 and 101 make it possible to determine the amplitude of the distortions along two orthogonal axes $O_a, O_b, O_c$ and $O_d$ in the present example and to deduce therefrom by simple calculations, the corrections to be made on the distance D separating the positioning corrections relative to this mask.

For this purpose, the enclosure 9 containing the x-ray source S is integral with a member 92 for moving along axis Z and associated with a position sensor 910. The output signals of this sensor are transmitted to the data processing means 82 by a transmission channel $l_9$ and a supplementary channel $l_{10}$ carries the control signals processed by the data processing means 82 to the displacement member 92. These control signals are processed, under the control of the recorded programme, on the basis of position information (output signals from sensor 910) and data for evaluating the corrections to be made beforehand (evaluation phase). The possible positioning corrections, to take account of non-linear distortions are carried out by again putting into operation the member 10 for displacing mask 1, by transmitting via channel $l_5$ signals for controlling the positional displacements $Z'_1$, $Z'_2$ and $Z'_3$.

In addition, the signals supplied by the position sensors can be used in feedback for positioning control purposes.

These position sensors can be of any type compatible with the desired precisions. For the members 10 and 21 for positioning mask 1 and wafer 2, preference is given to the use of optical interferometers with fringe counters, which also generate digital signals, which can be more directly used by a digital computer. An electromechanical sensor or transducer can be used for the X-ray source displacement member 92. Thus, in a typical embodiment, source S must be displaceable by 40 mm on either side of a mean position, with an accuracy of ±0.4 mm.

Naturally, the data processing means 82 can also be used for controlling the subsequent exposure to X-radiation phase of wafer 2 across mask 1. This operation falls outside the scope of the invention.

The invention is not limited to the alignment process and the embodiments of the alignment apparatus described hereinbefore. Thus, for forming the mask, it is possible to use all the variants described in the aforementioned U.S. Patent and which have not been described again in full here.

What is claimed is:

1. A process for optical alignment along two orthogonal alignment axes of patterns in two planes in close proximity in an exposure means, incorporating a divergent radiation source located at a given distance from the first plane, said patterns having relative dimensional distortions, wherein the process comprises:

a first preliminary stage of inscribing three pairs of reference patterns disposed on two orthogonal axes parallel to said alignment axes and intersecting at a point in a central region of the patterns to be aligned, each pair of the reference patterns including a first reference pattern inscribed on the first plane being formed by at least one lens having linear Fresnel zones, which are alternately opaque and transparent and perpendicular to one of the alignment axes in said plane, and a second reflecting reference pattern inscribed on the second plane and having a central zone perpendicular to said alignment axes, the central zone of the second reference pattern also being etched to form a reflector phase grating having a constant spacing extending parallel to the axes on which they are arranged;

a stage during which the two planes are positioned parallel to one another, to within a given tolerance;

an alignment stage along said two orthogonal axes and in rotation about a third axis orthogonal to the two planes and intercepting the divergent radiation source, said alignment stage consisting of illuminating, by means of a parallel monochromatic light beam, each lens with linear Fresnel zones in such a way as to form in the second plane, a line of light having substantially the same dimensions as the central zone of the second patterns inscribed on said second plane, the detection of a fraction of the radiation reflected by said second plane and emerging from the lens with linear Fresnel zones, the displacement of the two planes relative to one another until the detected radiation passes through an extreme value corresponding to the alignment of the two reference patterns of each pair, followed by the repetition of these operations for each of the axes to be aligned, said divergent radiation source forming on the second plane the image of the pattern of the first plane by a cast shadow with magnification G obeying the equation $G=1+e/D$, in which e is the given tolerance between the two lanes and D the distance separating the source from the first plane;

a second preliminary stage consisting of inscribing on two additional orthogonal axes intersecting at the third axis at least two pairs of supplementary reference patterns of an identical nature to the alignment reference patterns, the reference patterns of each supplementary pair extending in a direction orthogonal to the two orthogonal axes of said three pairs of reference patterns;

a stage following the alignment stage for determining the dimensional distortions of the two patterns consisting of operations of illuminating by a parallel monochromatic light beam each lens having linear Fresnel zones pairs of supplementary reference patterns, in such a way as to form in the second plane a line of light having subtantially the same dimension as the central zone of the patterns inscribed on said second plane, detecting a fraction of the radiation reflected by said second plane and emerging from the lens having linear Fresnel zones in accordance with said orthogonal directions for the displacement of the two planes relative to one another until the detected radiation passes through an extreme value corresponding to the alignment of the two reference patterns, storing the displacement in sign and amplitude, followed by the repetition of these operations for each pair of supplementary patterns and the determination of a correction quantity on the basis of the successive displacement values;

an adjustment stage of said magnification on the basis of the correction magnitude in order to obtain a compensation of the relative dimensional distortions.

2. A process according to claim 1, wherein the adjustment of the magnification takes place by modifying in amplitude and in sign, the given distance separating the source from the first plane, the tolerance between the planes remaining constant.

3. A process according to claim 1 wherein the adjustment of the magnification takes place by modifying in amplitude and in sign the tolerance between the two planes, the distance separating the source from the first plane remaining constant.

4. A process according to claim 1, wherein the relative dimensional distortions involve a linear variation component and a non-linear variation component, the adjustment of the magnification taking place by modifying the distance separating the source from the first plane, in order to obtain a compensation of the linear variation component, and by modifying the relative positioning of the two planes in order to obtain a compensation of the non-linear variation component.

5. A process according to one of the claims 1 to 4, wherein the second preliminary stage comprises the inscription of four pairs of supplementary reference patterns, distributed in a symmetrical manner with respect to the third axis and wherein said two additional orthogonal axes form an angle $\pi/4$ radians with the orthogonal alignment axes.

6. A process according to claim 1, wherein the radiation is a wavelength radiation in the X-ray range.

7. An apparatus for performing a processing for optical alignment along two orthogonal alignment axes of patterns in two first and second planes in close proximity, said planes defined by a mask and a substrate, said patterns having relative dimensional distortions, said process including a first preliminary stage of inscribing three pairs of reference patterns disposed on two orthogonal axes parallel to said alignment axes and intersecting at a point in a central region of the patterns to be aligned, each pair of the reference patterns having a first reference pattern inscribed on the first plane being formed by at least one lens having linear Fresnel zones, which are alternately opaque with transparent and perpendicular to one of the alignment axes in said plane, and a second reflecting reference pattern inscribed on the second plane and having a central zone perpendicular to said alignment axes, the central zone of the second reference pattern also being etched to form a reflector phase grating having a constant spacing extending parallel to the axes on which they are arranged; a stage during which the two planes are positioned parallel to one another, to within a given tolerance; an alignment stage along said two orthogonal axes and in rotation about a third axis orthogonal to the two planes and intercepting the divergent radiation source, said alignment stage consisting of illuminating, by means of a parallel monochromatic light beam, each lens with linear Fresnel zones in such a way as to form in the second plane, a line of light having substantially the same dimensions as the central zone of the second patterns inscribed on said second plane, the detection of a fraction of the radiation reflected by said second plane and emerging from the lens with linear Fresnel zones, the displacement of the two planes relative to one another until the detected radiation passes through an extreme value corresponding to the alignment of the two reference patterns of each pair, followed by the repetition of these operations for each of the axes to be aligned, said divergent radiation source forming on the second plane the image of the pattern of the first plane by cast shadow with magnification G obeying the equation $G = 1 + e/D$, in which e is the given tolerance between the two planes and D the distance separating the source from the first plane; a second preliminary stage consisting of inscribing on tow additional orthogonal axes intersecting at the third axis at least two pairs of supplementary reference patterns of an identical nature to the alignment reference patterns, the reference patterns of each supplementary pair extending in a direction orthogonal to the two orthogonal axes of said three pairs of reference patterns; a stage following the alignment stage for determining the dimensional distortions of the two patterns by illuminating each lens having linear Fresnel zones pairs of supplementary reference patterns, in such a way as to form in the second plane a line of light having substantially the same dimension as the central zone of the patterns inscribed on said second plane, detecting a fraction of the radiation reflected by said second plane and emerging from the lens having linear Fresnel zones in accordance with said orthogonal directions for the displacement of the two planes relative to one another until the detected radiation passes through an extreme value corresponding to the alignment of the two reference patterns, storing the displacement in sign and amplitude, followed by the repetition of these operations for each pair of supplementary patterns and the determination of a correction quantity on the basis of the successive displacement values; and an adjustment stage of said magnification on the basis of the correction magnitude in order to obtain a compensation of the relative dimensional distortions, said apparatus, comprising:

a divergent radiation source for the transfer by a cast shadow of said reference patterns defined by the mask in the first plane onto said second plane constituted by one of the main faces of said substrate;

optoelectronic relative alignment means in two orthogonal alignment directions and in rotation about said third axis orthogonal to the two planes with the aid of pairs of said alignment reference patterns;

a monochromatic light source associated with each of the pairs of supplementary reference patterns;

a device for projecting the radiation of said source in the form of a beam of parallel rays onto the mask in the zone including the Fresnel zone lens inscribed on the mask and means for the optoelectronic detection of a fraction of the radiation reflected by the substrate; and means for the relative displacement of the mask and the substrate in two directions parallel to the orthogonal alignment directions supporting the supplementary reference patterns, including sensors moving along axes supplying signals representing these displacements and means for displacing the divergent radiation source along said third axis orthogonal to the planes of the mask and the substrate associated with a position sensor of the source supplying signals representing the position thereof along said third axis.

8. An apparatus according to claim 7 also comprising means for adjusting the relative positioning of the planes of the mask and the substrate associated with sensors for the displacement along a direction orthogonal to the planes of the substrate and the mask, supplying signals representing the displacements in said direction.

9. An apparatus according to claim 7, wherein the monochromatic light sources associated with each of the pairs of supplementary reference patterns are obtained on the basis of the radiation of a single source emitting a parallel beam, which is split by semitransparent plates into a succession of beams, directed by deviating mirrors towards the said projection means.

10. An apparatus according to claim 7, wherein there are also data processing means receiving output signals from the sensors for the relative displacements of the mask and the substrate, as well as the position of the source, and output signals from the optoelectronic detection means, and wherein these data processing means incorporate programmed means for the determination, on the basis of these signals, of correction values transmitted to the displacement means of the source and to the relative positioning correction means of the planes of the mask and the substrate, so as to bring about an automatic compensation of the relative dimensional distortions.

* * * * *